(12) United States Patent
Wu (10) Patent No.: US 7,224,231 B2
(45) Date of Patent: May 29, 2007

(54) METHOD FOR TRANSFORMING OUTPUT SIGNALS OF A LOW-NOISE AMPLIFIER OF A WIRELESS TRANSCEIVER

(75) Inventor: Chia-Wei Wu, Taipei (TW)

(73) Assignee: RichWave Technology Corp., Taipei (TW)

( * ) Notice: Subject to any disclaimer, the term of this patent is extended or adjusted under 35 U.S.C. 154(b) by 141 days.

(21) Appl. No.: 10/907,153

(22) Filed: Mar. 23, 2005

(65) Prior Publication Data

US 2006/0164171 A1 Jul. 27, 2006

(30) Foreign Application Priority Data

Jan. 24, 2005 (TW) .............................. 94102066 A (51) Int. Cl.
*H03F 3/45* (2006.01)
(52) U.S. Cl. ...................... 330/301; 330/195
(58) Field of Classification Search ................ 330/165, 330/195, 301
See application file for complete search history.

(56) References Cited

U.S. PATENT DOCUMENTS 6,275,687 B1* 8/2001 Lloyd ........................ 455/292
6,836,183 B2* 12/2004 Wight .................... 330/124 R

* cited by examiner

*Primary Examiner*—Steven J. Mottola
(74) *Attorney, Agent, or Firm*—Winston Hsu (57) ABSTRACT

A method for transforming single-ended signals outputted from a low-noise amplifier of a wireless transceiver into differential signals. The method includes: providing a transformer according to a default requirement of the wireless transceiver; transferring the single-ended signals provided by the low-noise amplifier to a first end of a primary end of the transformer, and coupling a second end of the primary end of the transformer to a power source; grounding a center tap of a secondary end of the transformer; and outputting the differential signals from two ends of the secondary end of the transformer.

2 Claims, 9 Drawing Sheets

METHOD FOR TRANSFORMING OUTPUT SIGNALS OF A LOW-NOISE AMPLIFIER OF A WIRELESS TRANSCEIVER

BACKGROUND OF INVENTION

1. Field of the Invention

The present invention provides methods for transforming output signals of a low-noise amplifier of a wireless transceiver, and more particularly, methods for transforming single-ended signals to differential signals, and for transforming differential signals to single-ended signals.

2. Description of the Prior Art

With developments of circuit technologies, an electric device can include multiple functions in a small case. In some applications, a single-ended signal must be transformed into a pair of differential signals for increasing precision. For example, in a wireless transceiver, a low-noise amplifier, utilized for amplifying received signals, providing an adequate gain and minimizing noise as possible, is the first stage of the transceiver. In analog circuits, a differential source-couple pair or a differential emitter-couple pair can reduce even-order harmonic noise caused by a non-linear system, which is the biggest advantage in comparison with a single-ended amplifier. Therefore, configurations of the differential source-couple pair or the differential emitter-couple pair are usually applied for a design of the low-noise amplifier in the wireless transceiver. Because the low-noise amplifier is the first stage of the wireless transceiver, when applying the above-mentioned configurations, the wireless transceiver must include two input pins. In order to conserve space, cost, and current, a single-to-differential converter is needed for transforming single-ended signals to differential signals, and realizing a low-noise amplifier with a single-ended input and a pair of differential outputs.

Figure 1:
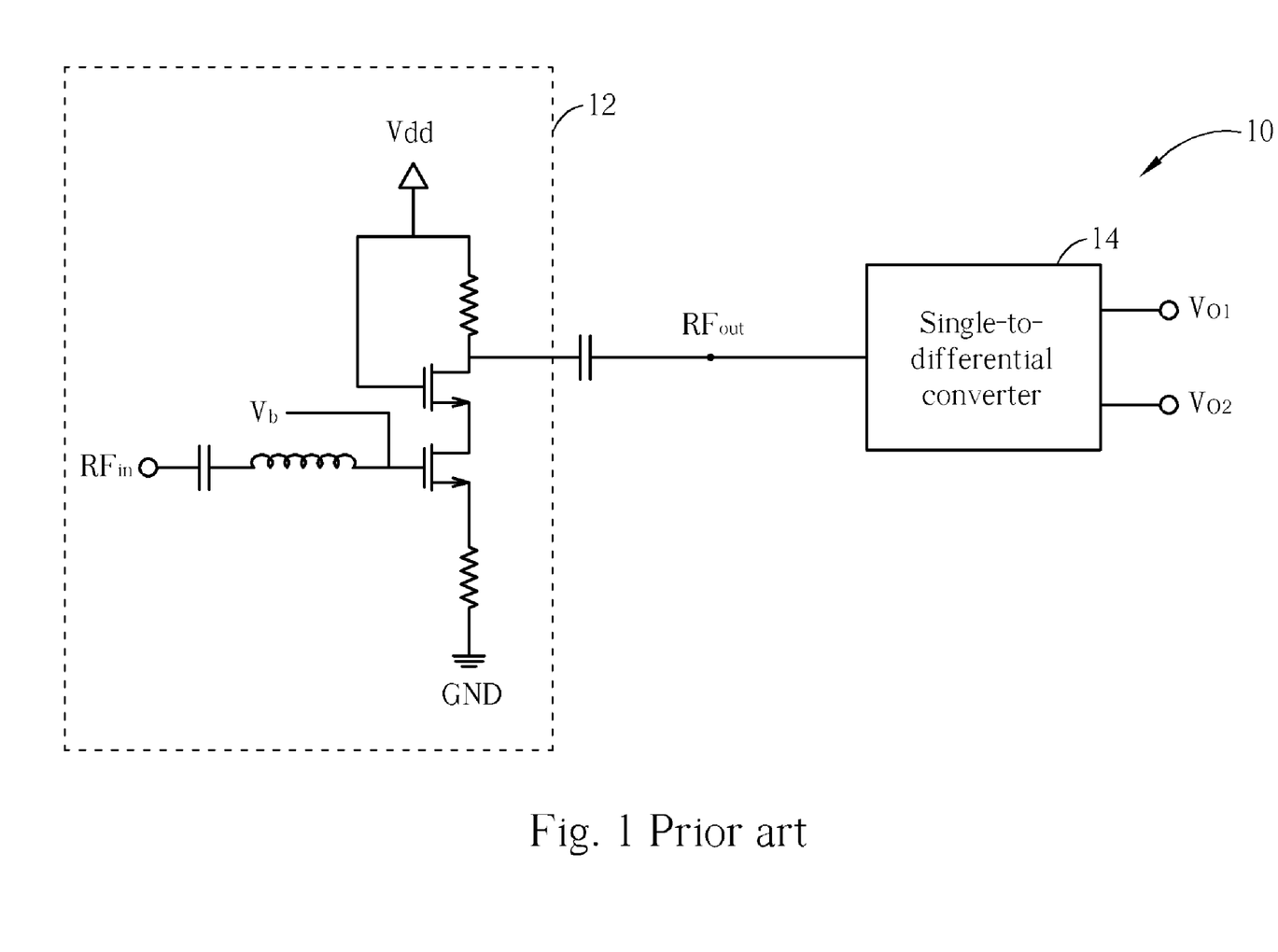
FIG. 1 illustrates a schematic diagram of a prior art low-noise amplifier with a single-ended input and a pair of a pair of differential outputs.

Please refer to FIG. 1, which illustrates a schematic diagram of a prior art low-noise amplifier 10 with a single-ended input and a pair of differential outputs. The amplifier 10 includes a first-stage amplifier 12 and a single-to-differential converter 14. The first-stage amplifier 12 is coupled to a power source $V_{dd}$ and ground GND, and is biased with a bias $V_b$ for operating in a saturation area. After receiving a radio signal $RF_{in}$, the first-stage amplifier 12 amplifies the radio signal $RF_{in}$ to become a radio signal $RF_{out}$, which is sent to the single-to-differential converter 14. The single-to-differential converter 14 transforms the single-ended signal $RF_{out}$ into differential signals $V_{O1}$ and $V_{O2}$. The single-to-differential converter 14 can be a balance-to-un-balance, or BALUN, circuit or a buffer composed of passive or active elements. Please refer to FIG. 2, which illustrates a schematic diagram of a prior art single-to-differential converter 20 applying passive elements. With capacitors and resistors, the single-to-differential converter 20 can transform the radio signal $RF_{out}$ into the signals $V_{O1}$ and $V_{O2}$. Please refer to FIG. 3, which illustrates a schematic diagram of a prior art single-to-differential converter 30 applying active elements. The single-to-differential converter 30 can also transform the radio signal $RF_{out}$ into the signals $V_{O1}$ and $V_{O2}$.

Figure 2:
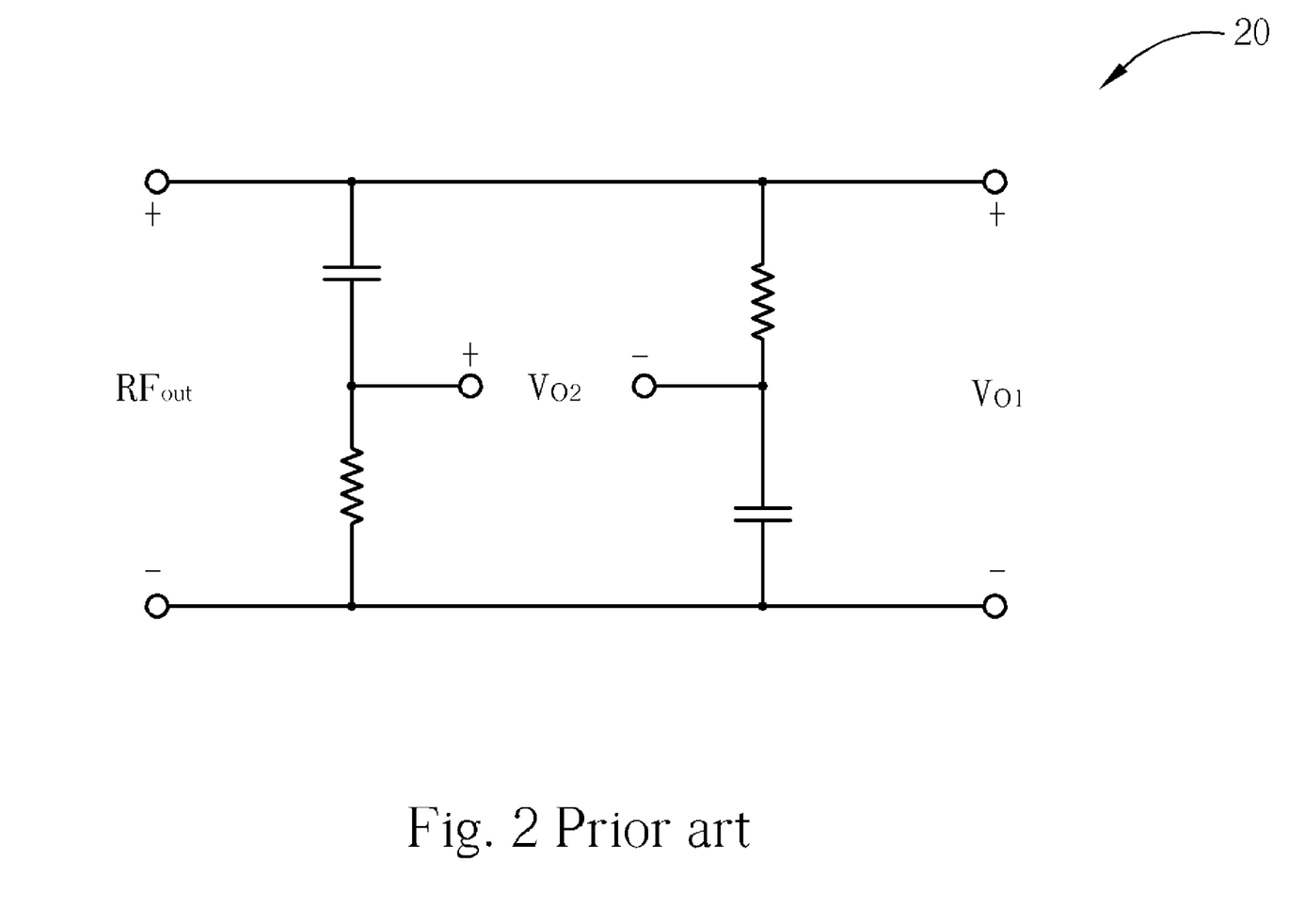
FIG. 2 illustrates a schematic diagram of a prior art single-to-differential converter applying passive elements.
Figure 3:
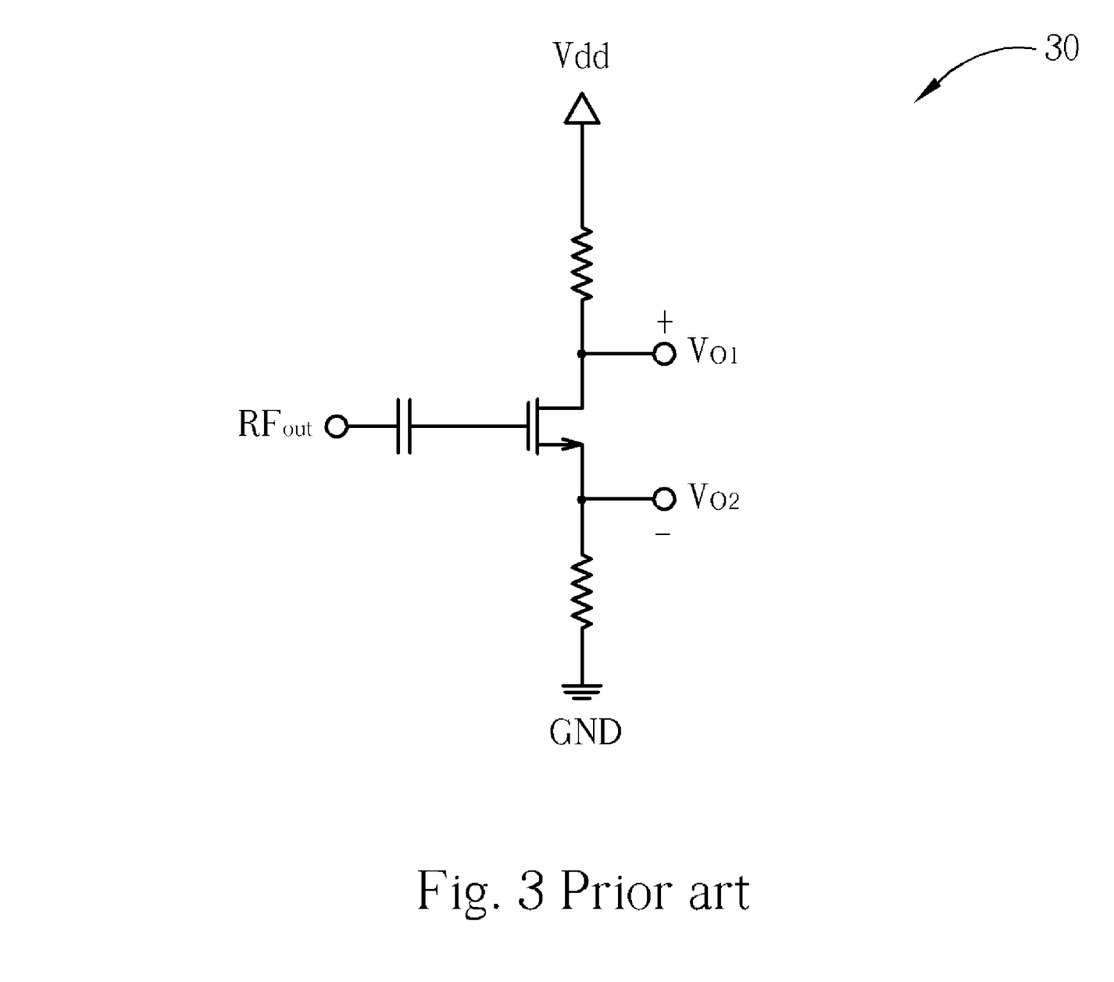
FIG. 3 illustrates a schematic diagram of a prior art single-to-differential converter applying active elements.

In short, the single-to-differential converter 20 in FIG. 2 and the single-to-differential converter 30 in FIG. 3 can transform the received signals $RF_{out}$ into the differential signals $V_{O1}$ and $V_{O2}$, and adjust to an optimum operating point according to the first-stage amplifier 12, so as to decrease a noise figure and increase the gain and linearity of the low-noise amplifier 10. However, because the single-to-differential converter 14 in FIG. 1 can be seen as the second stage of the low-noise amplifier 10, the single-to-differential converter 14 will decrease the linearity of the low-noise amplifier 10, and increase current consumption and required area, and more seriously, the wireless transceiver may have errors when receiving signals.

Figure 4:
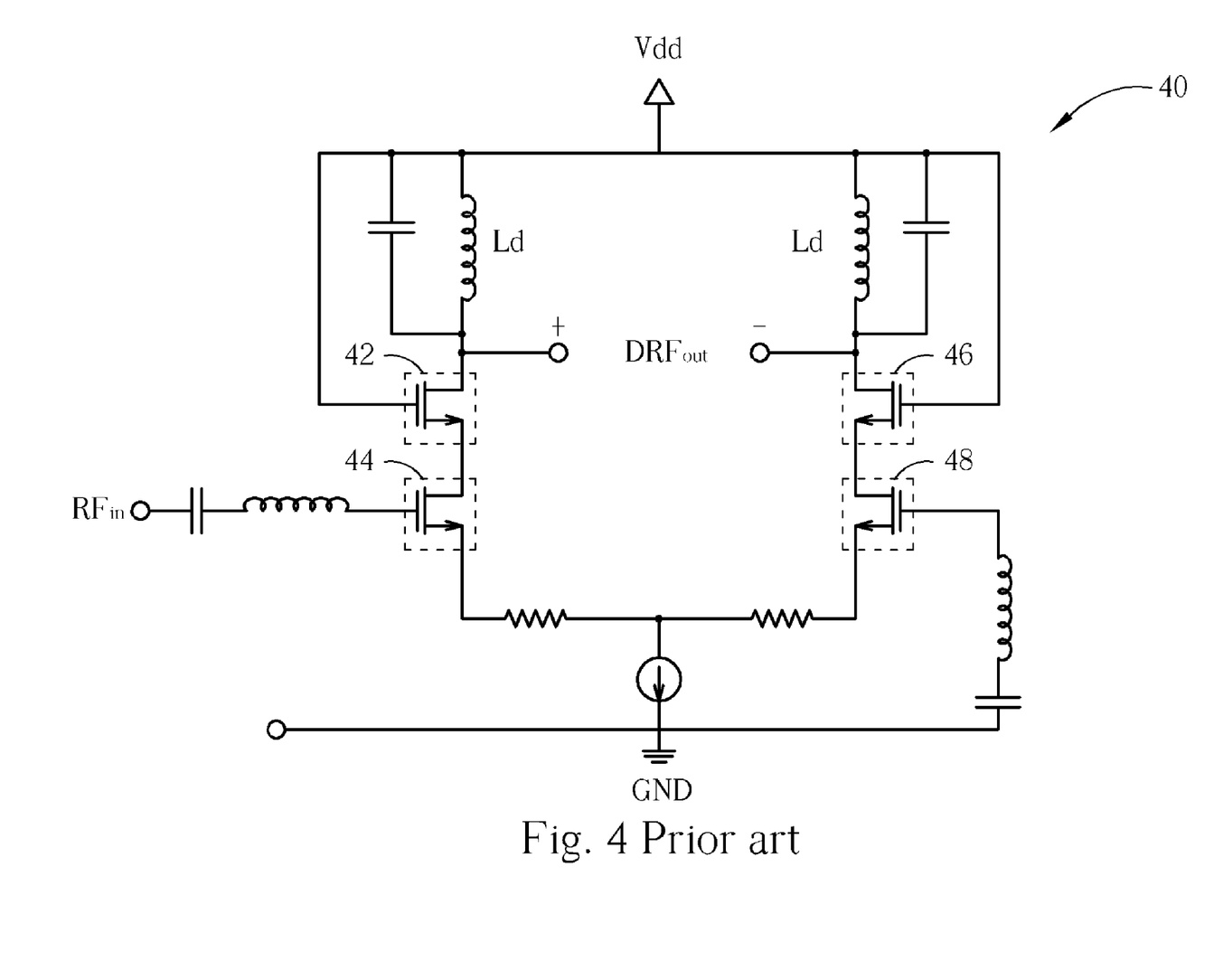
FIG. 4 illustrates a schematic diagram of a prior art low-noise amplifier with a signal-ended input and a pair of differential outputs.

Please refer to FIG. 4, which illustrates a schematic diagram of a prior art low-noise amplifier 40 with a signal-ended input and a pair of differential outputs. The low-noise amplifier 40 includes MOS transistors 42, 44, 46, and 48 for amplifying the single-ended radio signal $RF_{in}$, and outputting differential signals $DRF_{out}$ from drains of the MOS transistors 42 and 46. As shown in FIG. 4, the low-noise amplifier 40 does not need another single-to-differential converter, but is able to output the differential signals. However, the low-noise amplifier 40 does not decrease current consumption and required area. Moreover, although the low-noise amplifier 40 has fewer stages than the low-noise amplifier 10, the linearity of the low-noise amplifier 40 is not better than that of the low-noise amplifier 10. In FIG. 4, gates of the MOS transistors 46 and 48 couple to the power source $V_{dd}$ and the ground GND, so the gates of the MOS transistors 46 and 48 can be seen as logic groundings or AC (alternating current) groundings when operating in a small signal mode, or a high frequency mode. Therefore, an amplifier formed by the MOS transistors 46 and 48 is a common gate amplifier. Similarly, in high frequency situations, looking from a gate, or a signal input, of the MOS transistor 42 to the low-noise amplifier 40, the MOS transistors 42 and 48 form a common source amplifier. In short, an input stage of the low-noise amplifier 40 is the common source amplifier formed by the MOS transistors 42 and 48, while an output stage of the low-noise amplifier 40 is the common gate amplifier formed by the MOS transistors 46 and 48. As a result, input impedance and output impedance of the low-noise amplifier 40 are different, which decreases the linearity of the low-noise amplifier 40 and makes signals outputted from drains of the MOS transistors 42 and 46 have different amplitudes and different phases.

SUMMARY OF INVENTION

It is therefore a primary objective of the claimed invention to provide methods for transforming output signals of a low-noise amplifier of a wireless transceiver.

The present invention discloses a method for transforming single-ended signals outputted from a low-noise amplifier of a wireless transceiver into differential signals. The method includes: providing a transformer according to a default requirement of the wireless transceiver; transferring the single-ended signals provided by the low-noise amplifier to a first end of a primary end of the transformer, and coupling a second end of the primary end of the transformer to a power source; grounding a center tap of a secondary end of the transformer; and outputting the differential signals from two ends of the secondary end of the transformer.

The present invention further discloses a method for transforming differential signals outputted from a low-noise amplifier of a wireless transceiver into single-ended signals. The method includes: providing a transformer according to a default requirement of the wireless transceiver; transferring the differential signals provided by the low-noise amplifier to a first end and a second end of the primary end of the transformer; grounding a center tap of the primary end of the transformer and a first end of the secondary end of the transformer; and outputting the single-ended signals from a second end of the secondary end of the transformer.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
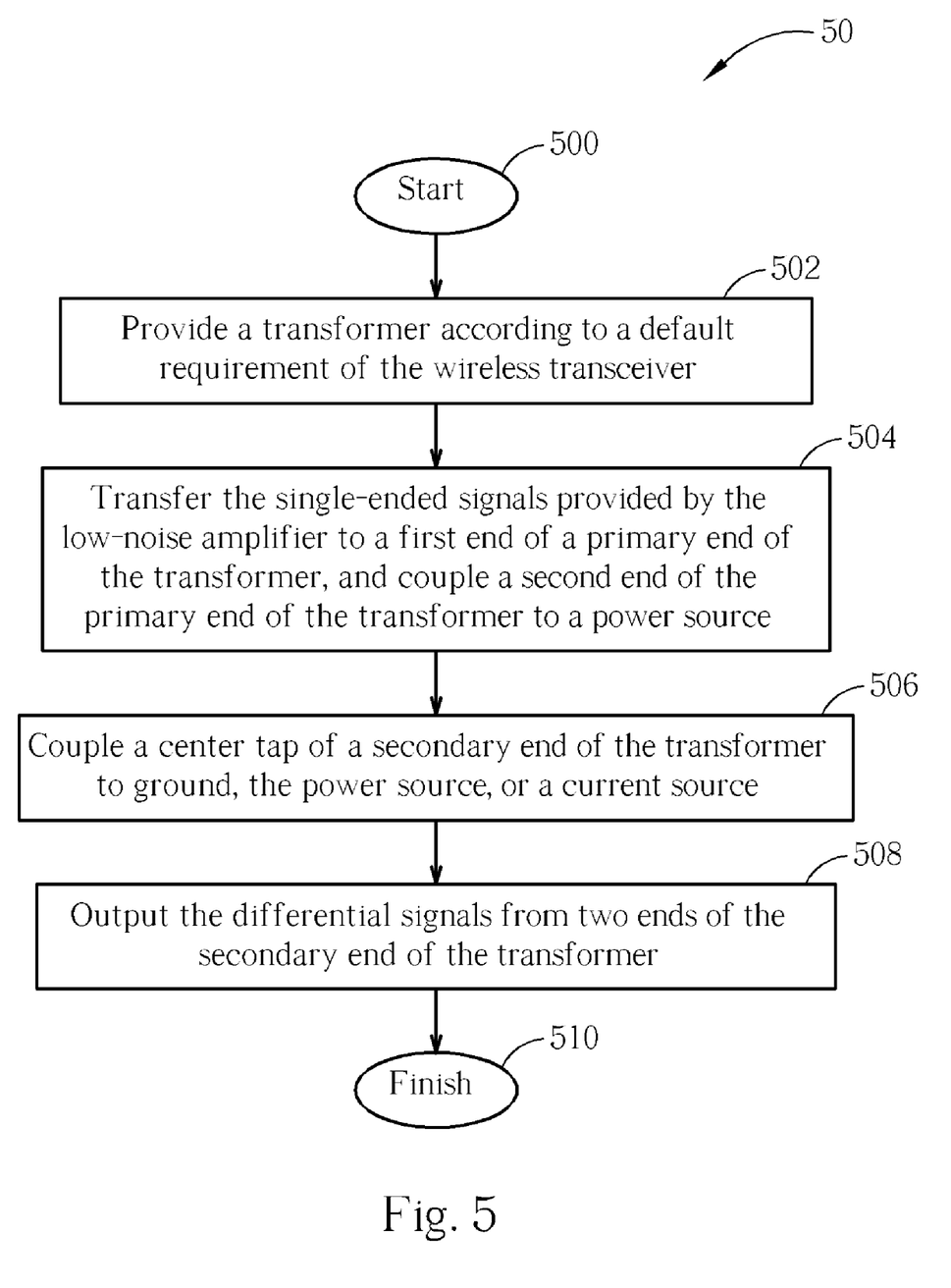
FIG. 5 illustrates a flowchart of a process for transforming single-ended signals outputted from a low-noise amplifier of a wireless transceiver into differential signals in accordance with the present invention.

Please refer to FIG. 5, which illustrates a flowchart of a process 50 for transforming single-ended signals outputted from a low-noise amplifier of a wireless transceiver to differential signals in accordance with the present invention. The process 50 includes following steps:

Step 500: start;

Step 502: provide a transformer according to a default requirement of the wireless transceiver;

Step 504: transfer the single-ended signals provided by the low-noise amplifier to a first end of a primary end of the transformer, and couple a second end of the primary end of the transformer to a power source;

Step 506: couple a center tap of a secondary end of the transformer to ground, the power source, or a current source;

Step 508: output the differential signals from two ends of the secondary end of the transformer;

Step 510: finish.

Ranges of voltage amplitude of signals received by the next stage of the low-noise amplifier may not be equal to that of signals outputted from the low-noise amplifier, so the process 50 refers to the default requirement of the wireless transceiver for providing the transformer. After determining the transformer, the single-ended signals outputted from the low-noise amplifier are transferred to one end of the primary end of the transformer, and the other end of the primary of the transformer is coupled to the power source. Then, the center tap of the secondary end of the transformer is grounded, so the differential signals are outputted from the two ends of the secondary end of the transformer.

Figure 6:
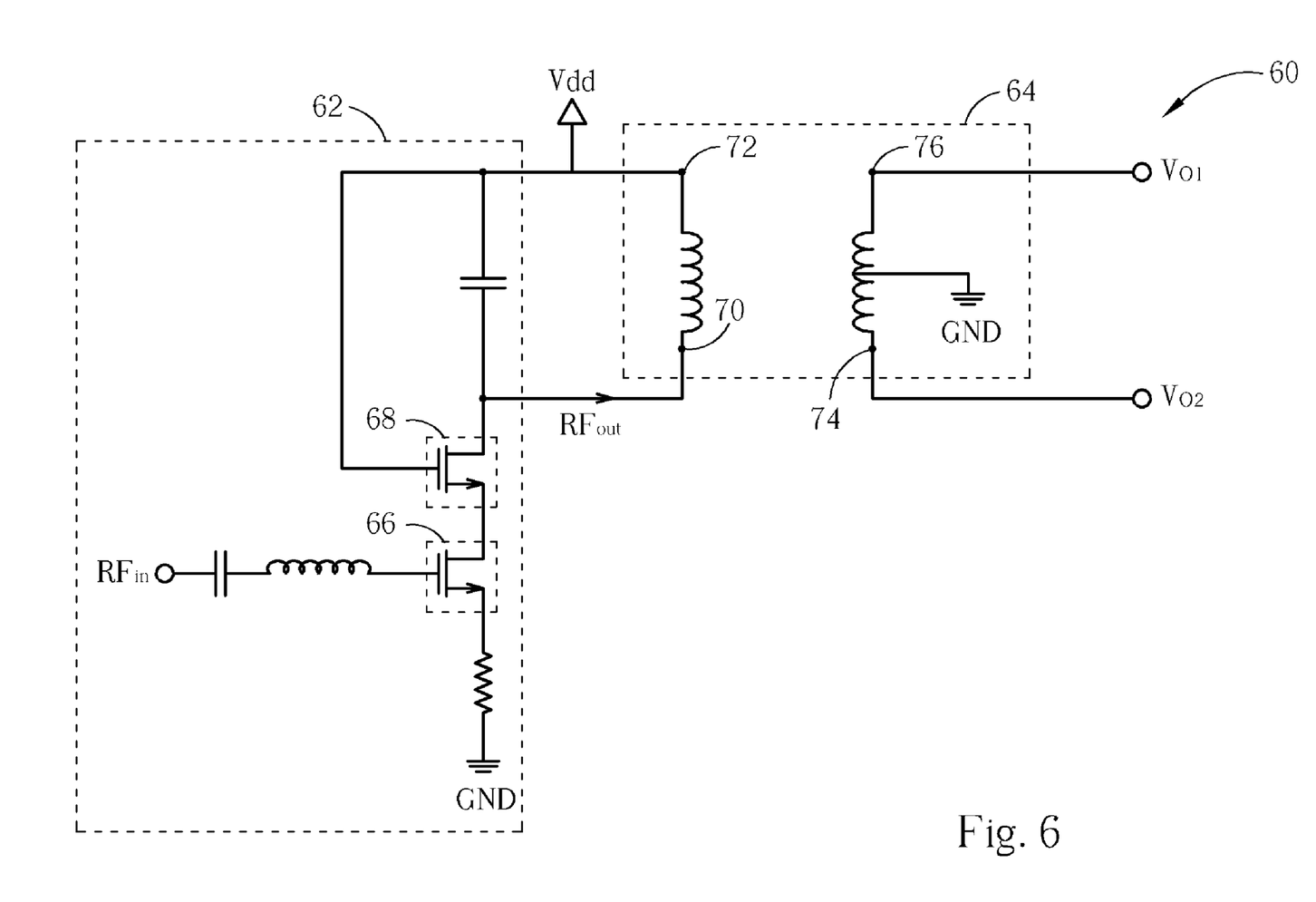
FIG. 6 illustrates a schematic diagram of a low-noise amplifier in accordance with the present invention.

Please refer to FIG. 6, which illustrates a schematic diagram of a low-noise amplifier 60 according to the process 50. The low-noise amplifier 60 includes an amplifier 62 and a transformer 64. In FIG. 6, the amplifier 62 receives a wireless signal $RF_{in}$ from a gate of a MOS transistor 66, and outputs a single-ended signal $RF_{out}$ from a drain of a MOS transistor 68. A primary end and a secondary end of the transformer 64 include points 70, 72, 74, and 76 in FIG. 6. The point 70 of the primary end of the transformer 64 is coupled to the drain of the MOS transistor 68 for receiving the single-ended signal $RF_{out}$, while the point 72 of the primary end is coupled to the power source $V_{dd}$. A center tap of the secondary of the transformer 64 is coupled to ground GND. Therefore, the low-noise amplifier 60 outputs differential signals $V_{O1}$, $V_{O2}$ from the points 74 and 76 of the secondary end of the transformer 64. In short, with the transformer 64, the low-noise amplifier 60 receives the single-ended signal $RF_{in}$ from the amplifier 62, amplifies the single-ended signal $RF_{in}$, and outputs the differential signals $V_{O1}$ and $V_{O2}$ from the transformer 64. Therefore, the low-noise amplifier 60 needs only one input terminal, meaning that the low-noise amplifier 60 can include only one input pin after packaging.

Figure 7:
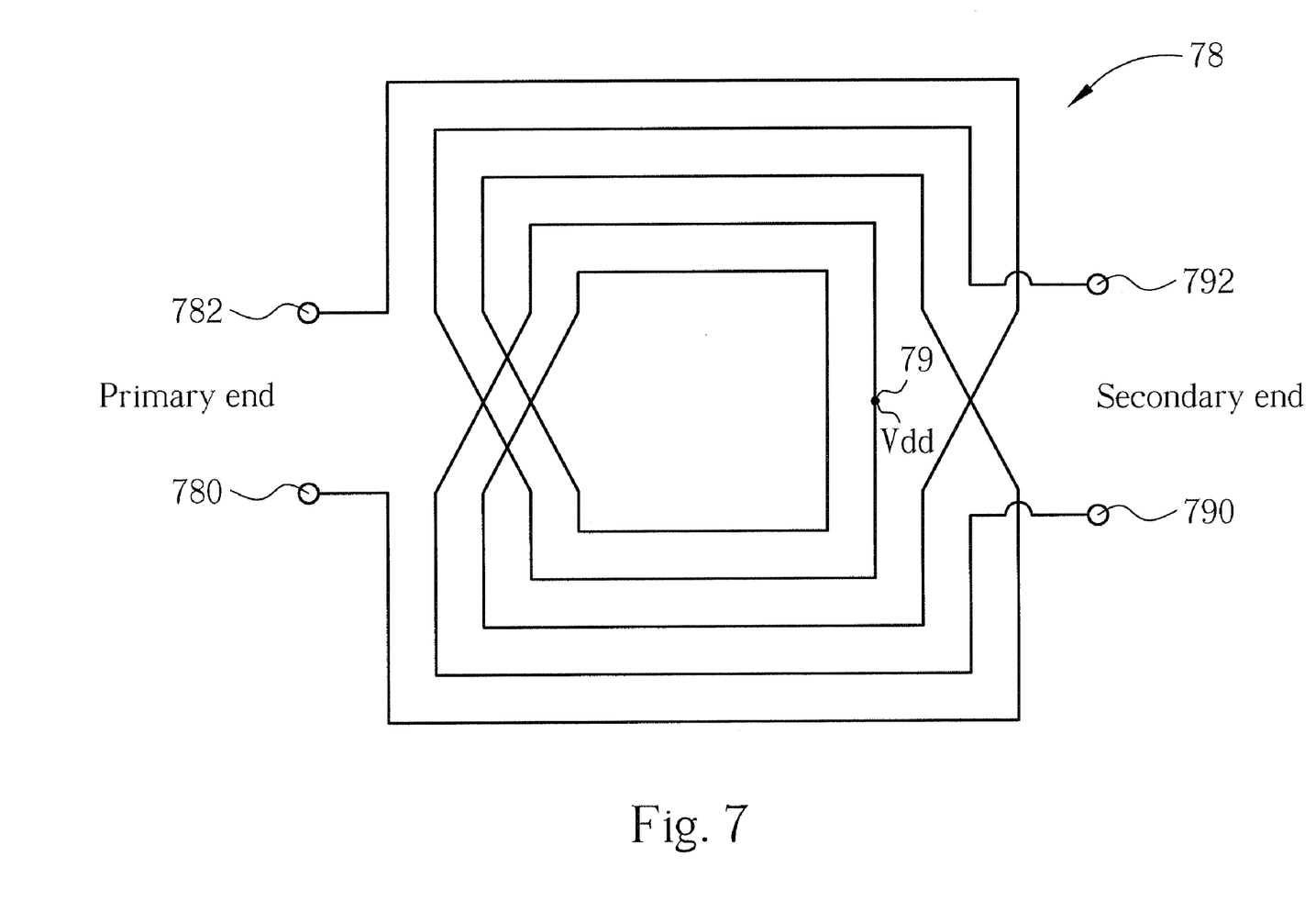
FIG. 7 illustrates a schematic diagram of an on-chip passive transformer.

The transformer 64 can be changed according to designer's wishes. For example, please refer to FIG. 7, which illustrates a schematic diagram of an on-chip passive transformer 78. The transformer 78 is a 3-to-2 transformer. Points 780 and 782 of a primary end of the transformer 78 in FIG. 7 correspond to the points 70 and 72 in FIG. 6, and points 790 and 792 of a secondary end of the transformer 78 in FIG. 7 correspond to the points 74 and 76 in FIG. 6. Then, coupling a center tap 79 of the secondary end of the transformer 78 to the ground GND or the power source $V_{dd}$, the transformer 78 can work in the low-noise amplifier 60. Other than the configuration of the transformer 78, configurations, such as a round shape, an octagon, or a pattern ground, can be utilized for the transformer 64 in FIG. 6.

Advantages of the low-noise amplifier 60 can be concluded as follows. First, the low-noise amplifier 60 includes a single input, so current consumption of the low-noise amplifier 60 is half that of the low-noise amplifier 40 in FIG. 4. Also, the low-noise amplifier 60 does not include a BALUN or a buffer shown in FIG. 1 to FIG. 3, so the low-noise amplifier 60 needs less current than the low-noise amplifier 10 in FIG. 1. Second, the size of the transformer 64 in the low-noise amplifier 60 equals to the size of an inductor $L_d$ in the low-noise amplifier 40 in FIG. 4, so the low-noise amplifier 60 is smaller than the low-noise amplifier 40, and certainly smaller than the low-noise amplifier 10, which includes two stages. Third, the linearity of the low-noise amplifier 60 will not be degraded by non-matching output impedance, like the low-noise amplifier 40, or by the use of two stages, like the low-noise amplifier 10. Fourth, unlike the low-noise amplifier 40, the low-noise amplifier 60 outputs signals with same phases and amplitudes. Fifth, the noise figure of the low-noise amplifier 60 is smaller than that of the low-noise amplifier 40 because the low-noise amplifier 60 includes the single input, and is smaller than that of the low-noise amplifier 10 since the low-noise amplifier 60 does not need the BALUN or the buffer.

Figure 8:
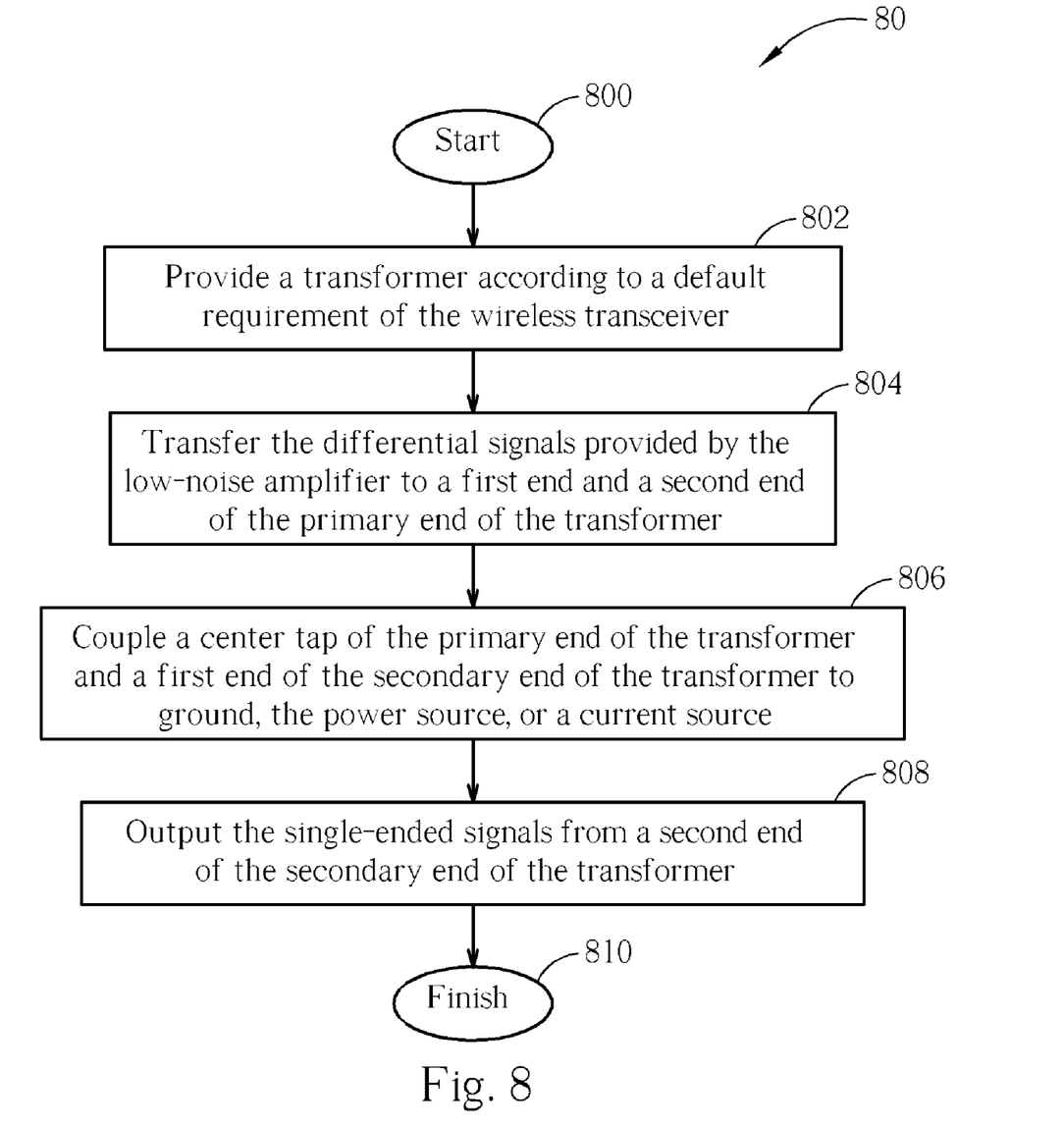
FIG. 8 illustrates a flowchart of a process for transforming differential signals outputted from a low-noise amplifier of a wireless transceiver to single-ended signals in accordance with the present invention.

In addition, the present invention provides another method for transforming differential signals to single-ended signals. Please refer to FIG. 8, which illustrates a flowchart of a process 80 for transforming differential signals outputted from a low-noise amplifier of a wireless transceiver into single-ended signals. The process 80 includes following steps:

Step 800: start;

Step 802: provide a transformer according to a default requirement of the wireless transceiver;

Step 804: transfer the differential signals provided by the low-noise amplifier to a first end and a second end of the primary end of the transformer;

Step 806: couple a center tap of the primary end of the transformer and a first end of the secondary end of the transformer to ground, the power source, or a current source;

Step 808: output the single-ended signals from a second end of the secondary end of the transformer;

Step 810: finish.

As with the process 50, because ranges of voltage amplitude of signals received by the next stage of the low-noise amplifier may not be equal to that of signals outputted from the low-noise amplifier, the process 80 refers to the default requirement of the wireless transceiver for providing the transformer. After determining the transformer requirement, the differential signals outputted from the low-noise amplifier are transferred to two ends of the primary end of the transformer, and the center tap of the primary end of the transformer is grounded. Then, the first end of the secondary end of the transformer is grounded, coupled to the power source, or the current source, so the single-ended signals are outputted from the second end of the secondary end of the transformer.

Figure 9:
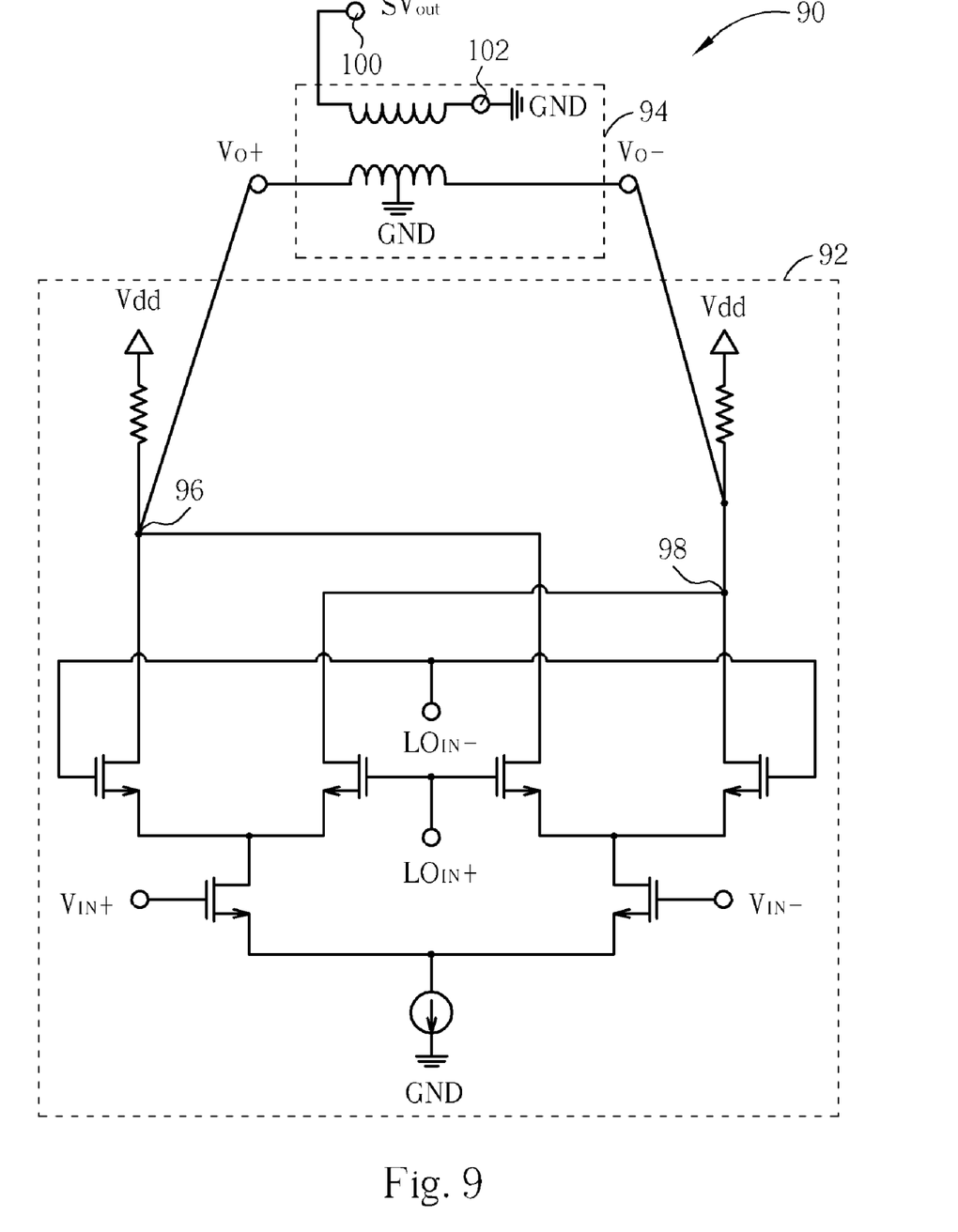
FIG. 9 illustrates a schematic diagram of a low-noise amplifier in accordance with the present invention.

Please refer to FIG. 9, which illustrates a schematic diagram of a low-noise amplifier 90 according to the process 80. The low-noise amplifier 90 includes an amplifier 92 and a transformer 94. The amplifier 92 is a differential-in and differential-out amplifier, which receives differential signals $V_{IN+}$ and $V_{IN-}$, is controlled by signals $LO_{IN+}$ and $LO_{IN-}$ provided by a local oscillator, and outputs differential signals $V_{O+}$ and $V_{O-}$ to the primary end of the transformer 94 from points 96 and 98 in FIG. 9. Then, the transformer 94 outputs a single-ended signal $SV_{out}=V_{O+}-V_{O-}$ from the other end of the secondary end.

In summary, the present invention provides methods for transforming single-ended signals and differential signals, which decreases current consumption and area of the low-noise amplifier, increases the linearity of the low-noise amplifier, and maintains phases and amplitudes of signals outputted from the low-noise amplifier with small noise figure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for transforming single-ended signals outputted from a low-noise amplifier of a wireless transceiver into differential signals comprising:
   (a) providing a transformer according to a default requirement of the wireless transceiver;
   (b) transferring the single-ended signals provided by the low-noise amplifier to a first end of a primary end of the transformer, and coupling a second end of the primary end of the transformer to a power source;
   (c) coupling a center tap of the secondary end of the transformer to the power source; and
   (d) outputting the differential signals from two ends of the secondary end of the transformer.

2. The method of claim 1, wherein in step (a), the default requirement of the wireless transceiver is determined according to a voltage source needed by the wireless transceiver, and the transformer is provided according to the default requirement.

* * * * *